(12) United States Patent
Mandelman et al.

(10) Patent No.: US 6,534,807 B2
(45) Date of Patent: Mar. 18, 2003

(54) LOCAL INTERCONNECT JUNCTION ON INSULATOR (JOI) STRUCTURE

(75) Inventors: Jack A. Mandelman, Stormville, NY (US); Dong Gan, Beacon, NY (US); Chung H. Lam, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/928,738

(22) Filed: Aug. 13, 2001

(65) Prior Publication Data

US 2003/0030106 A1 Feb. 13, 2003

(51) Int. Cl.[7] ............................................. H01L 29/80
(52) U.S. Cl. ...................................... 257/272
(58) Field of Search ................ 257/347, 272; 438/217

(56) References Cited

U.S. PATENT DOCUMENTS

| | | |
|---|---|---|
| 5,554,870 A | 9/1996 | Fitch et al. |
| 5,621,232 A | 4/1997 | Ohno |
| 5,911,114 A | 6/1999 | Naem |
| 5,915,199 A * | 6/1999 | Hsu ........................... 438/618 |
| 5,936,306 A | 8/1999 | Jeng |
| 5,953,604 A * | 9/1999 | Lien ........................... 438/217 |
| 6,081,016 A | 6/2000 | Tanaka et al. |
| 6,117,761 A | 9/2000 | Manning |
| 6,157,068 A | 12/2000 | Hashimoto et al. |

FOREIGN PATENT DOCUMENTS

JP   2000031293   10/2000

* cited by examiner

*Primary Examiner*—David Nelms
*Assistant Examiner*—Thao P Le
(74) *Attorney, Agent, or Firm*—Scully, Scott, Murphy & Presser; Joseph P. Abate

(57) ABSTRACT

A JOI structure and cell layout including at least one patterned gate stack region present atop a semiconductor substrate, said semiconductor substrate having source/drain diffusion regions of opposite dopant polarity abutting each other present therein, said source/drain diffusion regions are present atop an insulating layer, said insulating layer not being present beneath said at least one patterned gate stack region. An alternative JOI structure and cell layout of the present invention includes at least one patterned gate stack region present atop a semiconductor substrate, said semiconductor substrate containing at least a conductive region other than source/drain diffusion regions present atop an insulating layer embedded therein, said insulating layer not being present beneath said at least one patterned gate stack region, wherein said conductive region is in contact with vertical sidewalls of source/drain extension regions present in said semiconductor substrate, beneath said at least one patterned gate stack region.

22 Claims, 15 Drawing Sheets

LOCAL INTERCONNECT JUNCTION ON INSULATOR (JOI) STRUCTURE

RELATED APPLICATIONS

This application is related to co-assigned U.S. application Ser. No. 09/928,759, filed Aug. 13, 2001, the entire content of which is incorporated herein by reference.

FIELD OF THE INVENTION

The present invention relates to semiconductor structures, and more particularly to junction on insulator (JOI) structures which have low junction leakage, reduced junction capacitance, and substantially little or no floating body effects which, if present, may degrade the stability and/or threshold voltage of the semiconductor device. The present invention also provides a JOI structure which, not only eliminates isolation regions between adjacent source/drain diffusion regions of opposite dopant polarity, but the need for employing a local interconnect wiring region for connecting the source/drain diffusion regions of opposite dopant polarity to each other.

BACKGROUND OF THE INVENTION

A significant fraction of the total power consumption in low-power bulk complementary metal oxide semiconductor (CMOS) static random access memory (SRAM) and other devices is attributed to the junction leakage in the array which occurs during standby, i.e., when the device is not actively in operation. In typical low-power applications, the active duty factor is less than 1%. This results injunction leakage during standby contributing significantly to the total power. It is therefore necessary to find a means of reducing junction leakage in low-power bulk CMOS SRAMs.

Another problem facing many bulk semiconductor devices is performance degradation which is caused by high source/drain junction capacitance. Reduction in source/drain junction capacitance is thus required in many applications for improved performance.

It is known in the semiconductor industry that a junction on insulator structure allows for both source/drain junction leakage and capacitance to be reduced. Most of the commonly available junction on insulator structures are formed using a silicon-on-insulator (SOI) which includes a buried oxide layer that electrically isolates a top Si-containing layer from a bottom Si-containing substrate layer. A major drawback in forming junction on insulator structures on an SOI is that costly processing steps are required, particularly for the fabrication of the SOI substrate material itself. Moreover, SOI materials are highly susceptible to floating body effects which greatly limit the stability and threshold voltage of the overall device. Another drawback of using SOI materials in forming JOI structures is that it is extremely difficult and, in some instances, nearly impossible to integrate a bulk semiconductor device with a structure containing an SOI material. Such bulk semiconductor devices may include vertical bipolar transistors which may require an SOI material that is considerably thicker than desired for SOI MOSFETs.

A further problem facing bulk semiconductor devices is the need to have source/drain diffusion regions separated by an isolation region. The isolation region prevents the N+ diffusion from shorting to the adjacent N-well/substrate and the P+ diffusion from shorting to the adjacent P-well/substrate. A typical prior art SRAM cell layout is shown in FIGS. 1A (top-view) and 1B (cross-section through X1–X1'). Specifically, the prior art structure shown in FIGS. 1A–1B comprises semiconductor substrate 10 having P-well region 12 and N-well region 14 formed therein. The structure also includes isolation regions 16 that are formed in semiconductor substrate 10 which separate source/drain regions 38 of opposite dopant polarity, i.e., P+ and N+, from each other. The prior art structure also includes at least one patterned gate stack region 18 formed atop a surface of semiconductor substrate 10. The at least one patterned gate stack region includes at least gate dielectric 24, gate conductor 26 and sidewall spacers 30.

The prior art structure of FIGS. 1A–1B also includes local interconnect wiring level 75 formed atop source/drain diffusion regions 38 of opposite dopant polarity and cross-connect 77 formed atop a portion of interconnect wiring level 75. Note that the presence of the isolation region between adjacent source/drain diffusion regions of opposite dopant polarity shown in FIG. 1 results in a cell layout that is not compact.

In the cell layout of FIG. 1A, BL denotes the bitlines of the cell, BL* denotes bitline complement, and WL denotes the wordlines of the cell, which lay orthogonal to the bitlines. Vdd represents power supply, and GND represents ground.

Yet another problem associated with the prior art FIGS. 1A and 1B is the need for local interconnect wiring level 75 which is employed therein for connecting source/drain diffusion regions 38 of opposite dopant polarity that are separated by isolation regions 16. Thus, the local interconnect wiring level shown in these prior art figures is not free to be used with other wiring levels.

In view of the above drawbacks in the prior art, there is still a need for developing a new and improved JOI structures on a surface of a bulk semiconductor substrate which have low junction leakage and reduced junction capacitance associated therewith. Additionally, there exists a need for providing a JOI structure which, not only eliminates the isolation regions between source/drain diffusion regions of opposite dopant polarity, but the need for using a local interconnect wiring level as a means for connecting adjacent source/drain diffusion regions of opposite dopant polarity to each other.

SUMMARY OF THE INVENTION

One object of the present invention is to provide JOI structures on a bulk semiconductor substrate.

A further object of the present invention is to provide JOI structures in which standby power reduction caused by junction leakage is substantially reduced.

A yet further object of the present invention is to provide JOI structures having reduced junction capacitance.

A still further object of the present invention is to provide JOI structures which exhibit little or substantially no floating body effects.

An even further object of the present invention is to provide JOI structures which eliminate the need of using an isolation region to physically separate source/drain diffusion regions of opposite dopant polarity from each other.

An yet further object of the present invention is to provide JOI structures which eliminate the local interconnect wiring level which is employed in prior art structures for electrically connecting source/drain diffusion regions of opposite dopant polarity to each other.

Another object of the present invention is to provide JOI structures which result in a compact, dense cell layouts, e.g., SRAMs or inverters.

These and other objects and advantages are achieved in the present invention by providing JOI structures which contain an insulating layer such as an oxide formed beneath a conductive region, e.g., source/drain diffusion regions, but not under the channel region of a patterned gate stack region.

In one embodiment of the present invention, the inventive JOI structure comprises: at least one patterned gate stack region present atop a semiconductor substrate, said semiconductor substrate having source/drain diffusion regions of opposite dopant polarity abutting each other present therein, said source/drain diffusion regions are present atop an insulating layer, said insulating layer not being present beneath said at least one patterned gate stack region.

Note in the embodiment mentioned above, no isolation regions separate the source/drain regions of opposite dopant polarity. The inventive JOI structure mentioned above may also include a salicide region present atop the source/drain diffusion regions of opposite dopant polarity. In such an embodiment, a cross-connect layer may be formed on a portion of said salicide layer.

Another JOI structure that is disclosed in the present application comprises:

at least one patterned gate stack region present atop a semiconductor substrate, said semiconductor substrate containing at least a conductive region other than source/drain diffusion regions present atop an insulating layer embedded therein, said insulating layer not being present beneath said at least one patterned gate stack region, wherein said conductive region is in contact with vertical sidewalls of source/drain extension regions present in said semiconductor substrate, beneath said at least one patterned gate stack region.

In such an embodiment, a cross-connection layer may be formed atop the conductive layer.

A yet other JOI structure that is provided herein comprises:

at least one patterned gate stack region present atop a semiconductor substrate, said at least one patterned gate stack region having small, controlled dimension regions of conductive material adjacent thereto, each of which is in contact with said semiconductor substrate and self-aligned to an adjacent gate edge.

DETAILED DESCRIPTION OF THE INVENTION

Figure 1A:
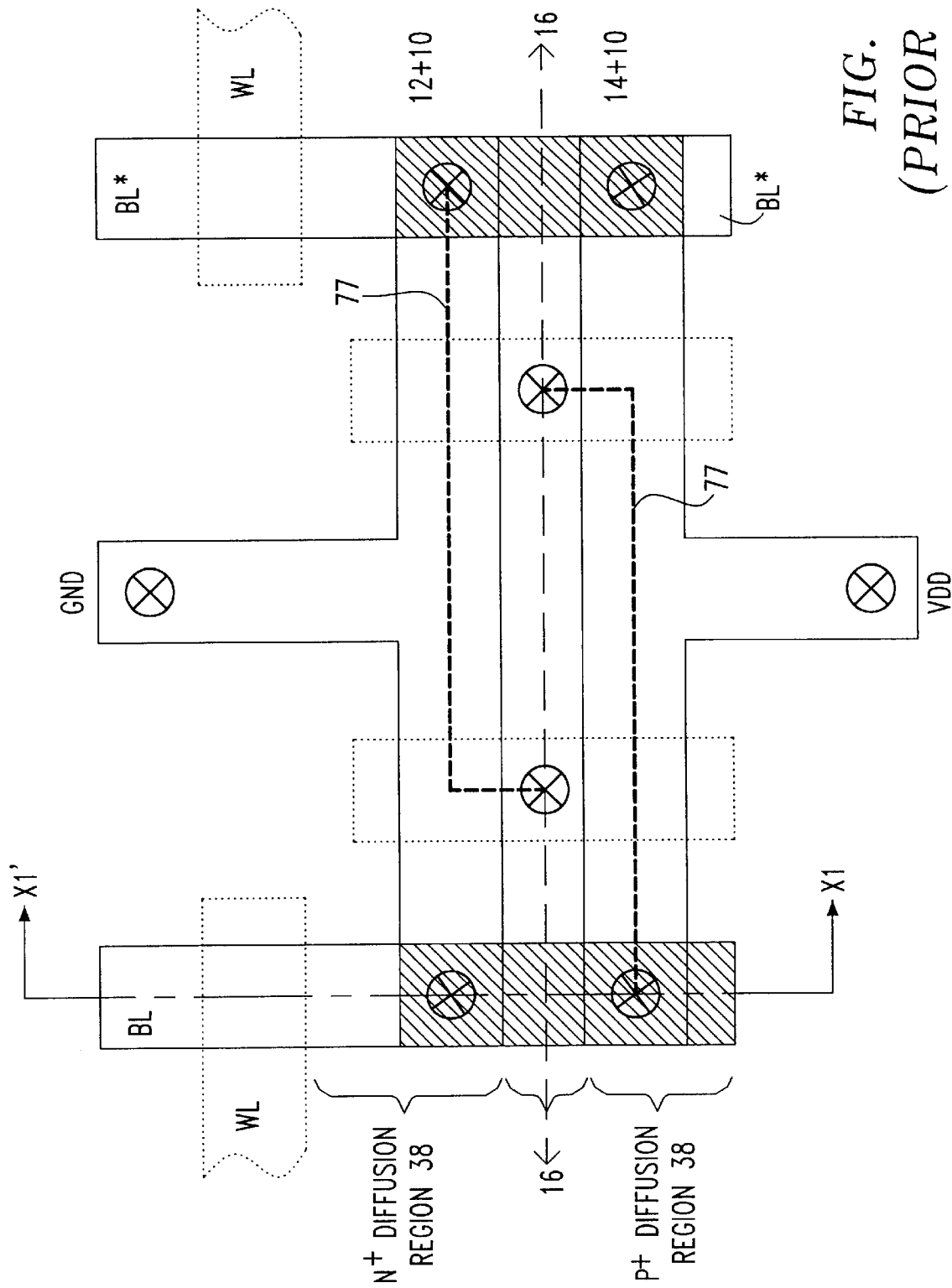
FIGS. 1A–1B are pictorial representations showing different views of a prior art cell layout; 1A is a top view; and 1B is a cross-sectional view through cut X1–X1'.
Figure 1B:
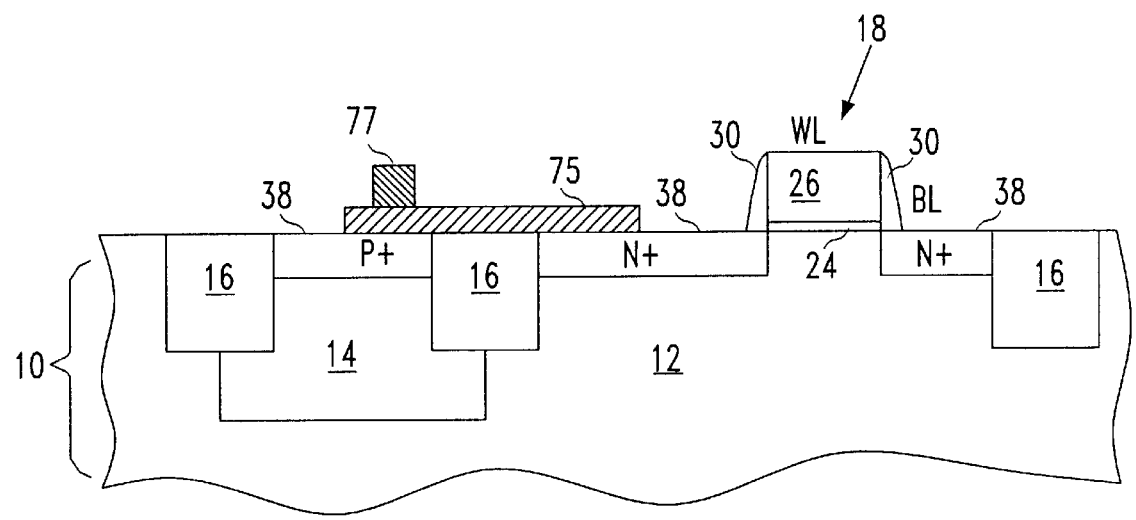

The present invention, which provides JOI structures on a bulk semiconductor substrate as well as cell layouts containing the same, will now be described in greater detail by referring to the drawings that accompany the present application. It is noted that like and/or corresponding elements of the drawings are referred to by like reference numerals.

Figure 2A:
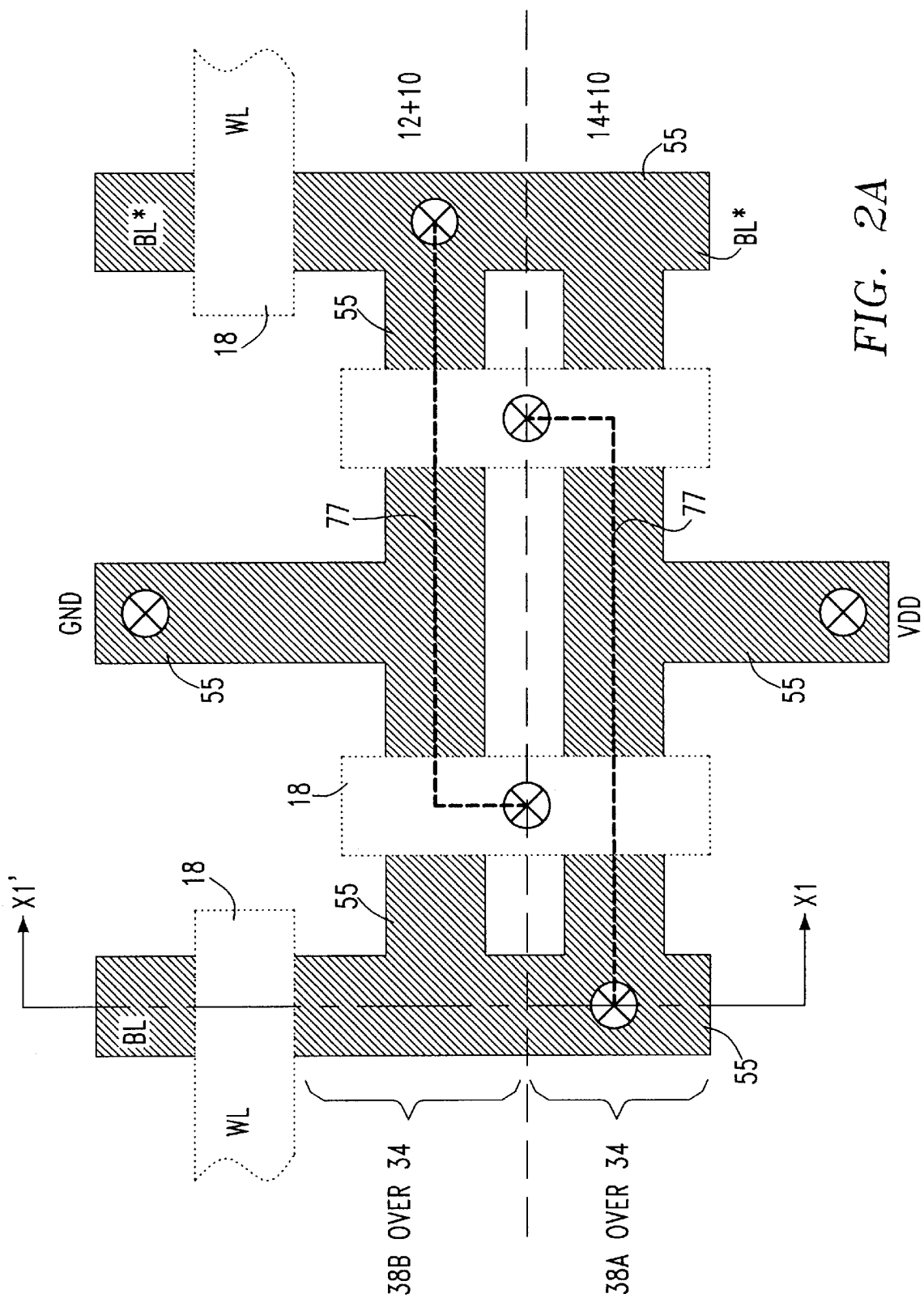
FIGS. 2A–2B are pictorial representations showing different views of an inventive cell layout; 2A is a top view; and 2b is a cross-sectional view through cut X1–X1'.
Figure 2B:
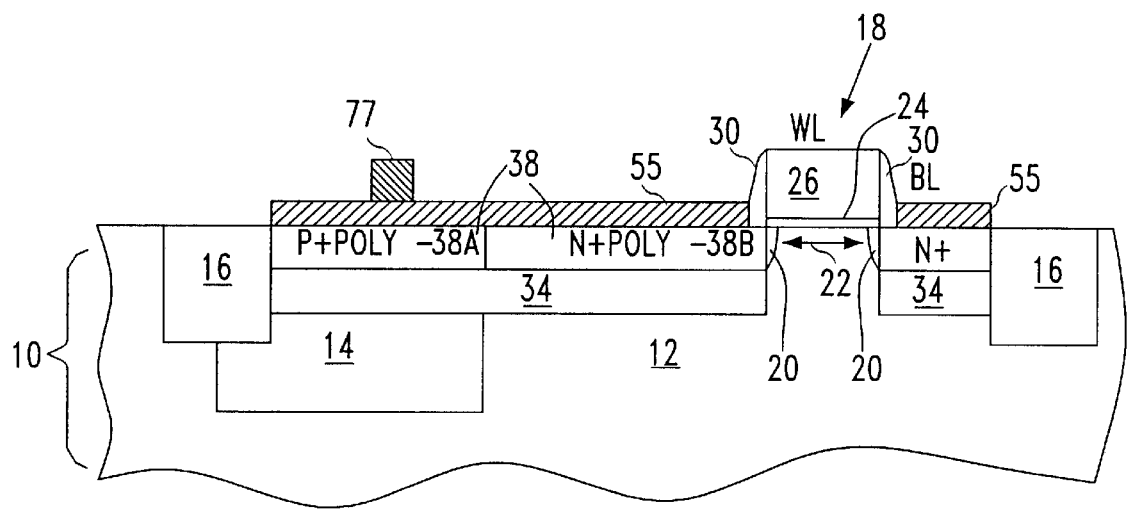

Reference is first made to FIGS. 2A and 2B which are pictorial representations of the inventive cell layout and JOI structure, respectively. Broadly speaking, the JOI structure shown in FIGS. 2A and 2B includes at least one patterned gate stack region 18 present atop semiconductor substrate 10. The at least one patterned gate stack region comprises source/drain extension regions 20, channel region 22, gate dielectric 24, gate conductor 26, and insulating spacers 30. The inventive JOI structure also includes source/drain diffusion regions 38 of opposite dopant polarity (labeled as 38A and 38B) abutting each other. The abutting source/drain diffusion regions are not separated by an isolation region, but instead are present atop insulating layer 34. The insulating layer is not however present beneath the at least one patterned gate stack region. Note that both the source/drain diffusion regions and insulating layer are embedded within the semiconductor substrate.

Moreover, the structure shown in FIGS. 2A–2B further includes: isolation regions 16 that are formed in the semiconductor substrate as well as well regions 12 (P-well) and 14 (N-Well) present in said substrate; salicide regions 55 that are formed atop the source/drain regions of opposite doping polarity; and cross-connect 77 which is formed atop each salicide region that is formed above regions 38A/38B. In FIG. 2A, the wordlines, WL, run orthogonal to the bitline, BL.

Note that in the structure shown in FIG. 2B, the source/drain diffusion regions of opposite dopant polarity are abutting each other since the presence of insulating layer 34 under the source/drain diffusions prevents shorting to the adjacent well. Since the diffusions are abutting each other, the local interconnect wiring, required in the prior art structure, is not needed in the inventive structure to connect the source/drain diffusions of opposite dopant polarity. Instead, in the embodiment depict in FIGS. 2A–2B, salicide region 55 provides the bridging of diffusion regions. It is emphasized that the inventive JOI structure results in denser (i.e., more compact) cell layouts (compared FIG. 2A with FIG. 1A) thereby providing a significant cost reduction as compared with prior art JOI structures.

Figure 3:
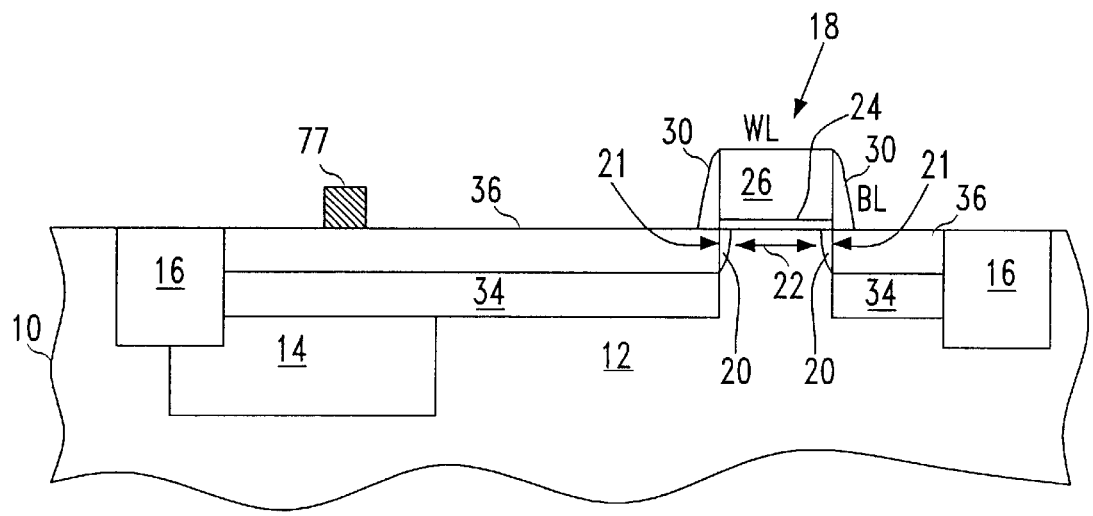
FIGS. 3 a pictorial representation (through a cross-sectional view) of an alternative JOI structure of the present application, wherein a conductive region other than heavy doped source/drain diffusion regions is employed.

FIG. 3 shows an alternative JOI structure of the present invention which comprises at least one patterned gate stack region 18 present atop semiconductor substrate 10. Adjacent to each patterned gate stack region and embedded in the substrate is a conductive region 36 other than source/drain diffusion regions atop insulating layer 34. As shown, insulating layer 34 is not present beneath that at least one patterned gate stack region. Note that in the inventive JOI structure shown in FIG. 3 conductive region 36 is in contact with vertical sidewalls 21 of source/drain extension regions 20 present in semiconductor substrate 10.

Since conductive region 36 is other than a doped Si-containing region, it is unnecessary to form salicide regions on conductive region 36. Instead, cross-connect 77 is formed directly atop conductive region 36.

Figure 4:
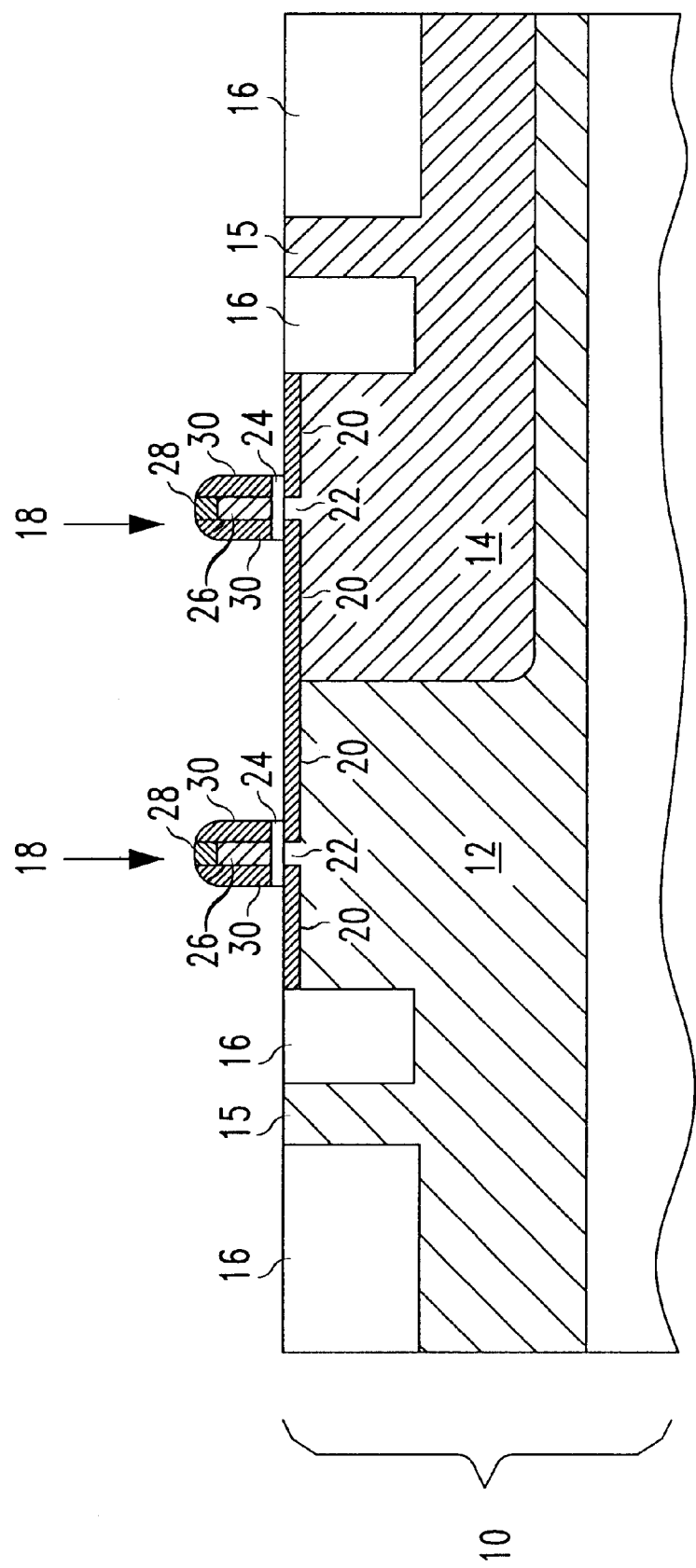
FIGS. 4–12 are pictorial representations (through cross-sectional views) showing the JOI structure of FIG. 2B or 3 through various processing steps of the invention.
Figure 5:
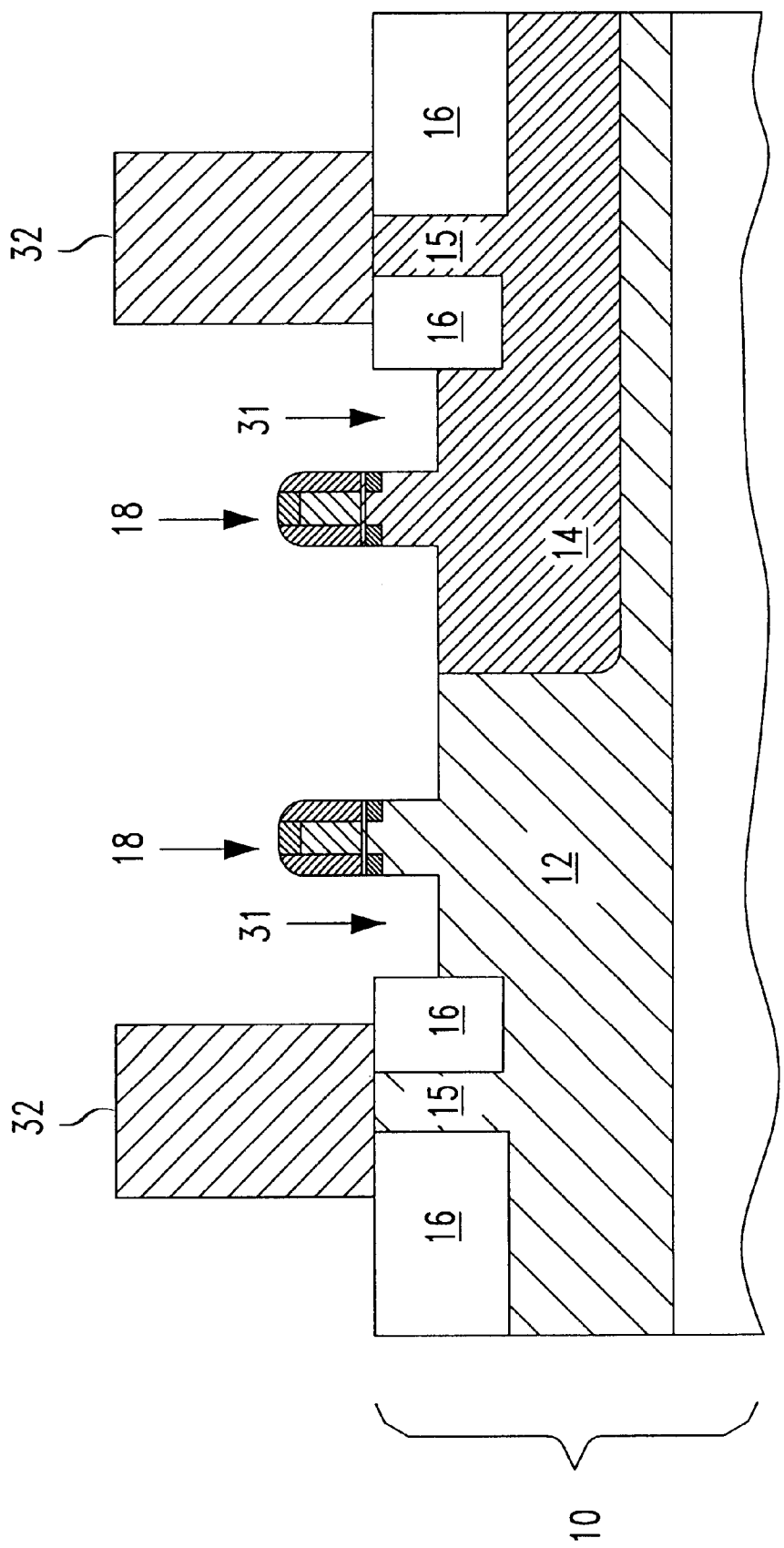

The following description details the various processing steps that can be employed in fabricating the structures shown in FIGS. 2A–2B and 3. Specifically, reference is made to FIGS. 4–12 which illustrate the basic processing steps employed in the present invention in forming a JOI structure on a bulk semiconductor substrate. Specifically, FIG. 4 illustrates an initial semiconductor structure that is formed prior to conducting the first step of the inventive method, i.e., prior to selectively recessing portions of a semiconductor substrate that abut one or more gate stack regions, while not recessing other portions of said semiconductor substrate that contain well contacts regions. Specifically, the structure shown in FIGS. 2A–2B comprises semiconductor substrate 10 (n or p-type) which includes P-well region 12 and N-well region 14 formed in portions thereof. The structure also includes isolation regions 16 which may be either shallow trench isolation regions or local oxidation of silicon isolation regions formed in portions of the substrate, within each well region. Combinations of these isolation regions are also contemplated herein. Well contact regions 15 (not specifically shown in FIGS. 2A–2B and 3) are also present between isolation regions 16.

The structure also includes patterned gate stack regions 18 that are formed atop the semiconductor structure. Each patterned gate stack region includes source/drain extension regions 20, channel region 22, gate dielectric 24, gate conductor 26, dielectric capping layer 28 and sidewall spacers 30.

The initial structure shown in FIG. 4 is fabricated using conventional CMOS processing steps that are well known in the art and it is composed of conventional materials that are also well known in the art. For example, semiconductor substrate 10 is comprised of any semiconductor material including, but not limited to: Si, Ge, SiGe, GaAs, InAs, InP and all other III/V compound semiconductors. Semiconductor substrate 10 may also be a layered semiconductor such as Si/Si or Si/SiGe. Of these various semiconductors, it is highly preferred that semiconductor substrate 10 be comprised of Si.

Well regions 12 and 14, respectively are formed by conventional well implantation processes well known in the art. Shallow trench isolation regions are formed utilizing lithography to define the trench opening, etching the trench opening with a conventional dry etching process such as reactive ion etching, lining the trench with a liner material, filling the trench with a dielectric fill material such as tetraethylorthosilicate (TEOS) and planarization. An optional densification step may be carried out prior to planarization. When LOCOS isolations are present, the LOCOS regions are formed by a local oxidation of Si process.

Gate stack regions 18 are then formed using conventional CMOS processing steps that are well known in the art for forming a field effect transistor (FET) on a surface of a semiconductor substrate. For example, the gate stack regions are formed by first forming via a conventional deposition process or a thermal growing process a gate dielectric layer on the surface of semiconductor substrate 10. The thickness of the layer of gate dielectric material 24 formed at this point of the present invention is not critical to the present invention, but typically, gate dielectric 24 has a thickness of from about 1 to about 20 nm after deposition, with a thickness of from about 1.5 to about 10 nm being more highly preferred. It is noted that the gate dielectric material employed in the present invention may be a conventional dielectric material such as $SiO_2$ or $Si_3N_4$, or alternatively, high-k dielectrics such as oxides of Ta, Zr, Hf, Al or combinations thereof may be employed. In one highly preferred embodiment of the present invention, gate dielectric 24 is comprised of an oxide such as $SiO_2$, $ZrO_2$, $Ta_2O_5$, $HfO_2$ or $Al_2O_3$.

After forming gate dielectric 24 on a surface of semiconductor substrate 10, gate conductor 26 is formed atop the layer of gate dielectric. The term "gate conductor" as used herein denotes at least one gate material which comprises a conductive material, a material that can be made conductive via a subsequent process such as ion implantation, or any combination thereof. Illustrative examples of suitable gate materials that can be employed in the present invention include, but are not limited to: polysilicon, amorphous silicon, elemental metals such as W, Pt, Pd, Ru, Rh and Ir, alloys of these elemental metals, silicides or nitrides of these elemental metals, and combinations thereof, e.g., a gate stack including a layer of polysilicon and a layer of conductive metal. A highly preferred gate material employed in the present invention is a gate material that is comprised of polysilicon or amorphous silicon.

Gate conductor 26 is formed on the surface of gate dielectric 24 utilizing a conventional deposition process well known in the art including, but not limited to: CVD, plasma-assisted CVD, evaporation, plating, or chemical solution deposition. When metal silicides are employed, a conventional silicide process may be used in forming the silicide layer. One such silicide process that can be used in the present invention includes the steps of: first forming an elemental metal, annealing the elemental metal so as to form a metal silicide layer therefrom, and removing any unreacted elemental metal utilizing a conventional wet etch process that has a high selectivity for removing unreacted metal as compared to silicide.

It is noted that in embodiments wherein a gate stack comprising multiple gate conductors is employed, e.g., a stack of polysilicon and elemental metal, an optional diffusion barrier (not shown in the drawings) may be formed between each layer of the gate stack. The optional diffusion barrier, which is formed utilizing conventional deposition processes such as those mentioned hereinabove, is comprised of a material such as SiN, TaN, TaSiN, WN, TiN and other like materials which can prevent diffusion of a conductive material therethrough.

As stated above, dielectric capping layer 28 is present atop the gate material. The dielectric capping layer is comprised of an oxide, nitride or oxynitride and it is formed utilizing a conventional deposition process such as, for example, CVD or plasma-assisted CVD. Alternatively, a conventional thermal growing process such as, for example, oxidation, may be used in forming dielectric capping layer 28.

The structure including dielectric capping layer, gate conductor and gate dielectric is then patterned utilizing conventional lithography and etching. Insulating spacer 30 (i.e., sidewall spacers) composed of an oxide, nitride, oxynitride or any combination or multilayers thereof is then formed on each exposed vertical sidewall of the etched gate region. Note that insulating spacers 30 are permanent spacers and are sometimes referred to herein as sidewall spacers since they are formed on exposed vertical sidewalls of the patterned gate stacks. Source/drain extensions 20 are formed in the semiconductor substrate at this point of the present invention utilizing conventional ion implantation and annealing processes well known in the art. Alternatively, source/drain extension regions 20 may be formed prior to forming insulating spacers 30. A gate sidewall oxidation step may precede implantation of the source/drain extension regions. Additionally, halo implants may be performed at the same time in the inventive process as the source/drain extension implants.

Next, a selective recessing process is performed by first protecting the well contact regions with mask 32 and thereafter utilizing a selective etching process that is highly selective in removing semiconductor material as compared to insulator or mask material. The resultant structure formed after these steps is shown, for example, in FIG. 5. Note that portions (labeled as 31) of the semiconductor substrate abutting each of the gate stack regions have been selectively recessed, while other portions of substrate containing well contacts 15 are not recessed due to the presence of mask 32 which protects the well contact regions.

The mask is formed by conventional lithography and a reactive ion etching process can be used in selective recessing the exposed portions of the semiconductor substrate. When the substrate is composed of Si, a reactive-ion etching chemistry containing a plasma of HBr and $Cl_2$ may be employed in the present invention. After the selective recessing process, the mask is removed from atop the well contacts using a conventional stripping technique that is well known to those skilled in the art.

Figure 6:
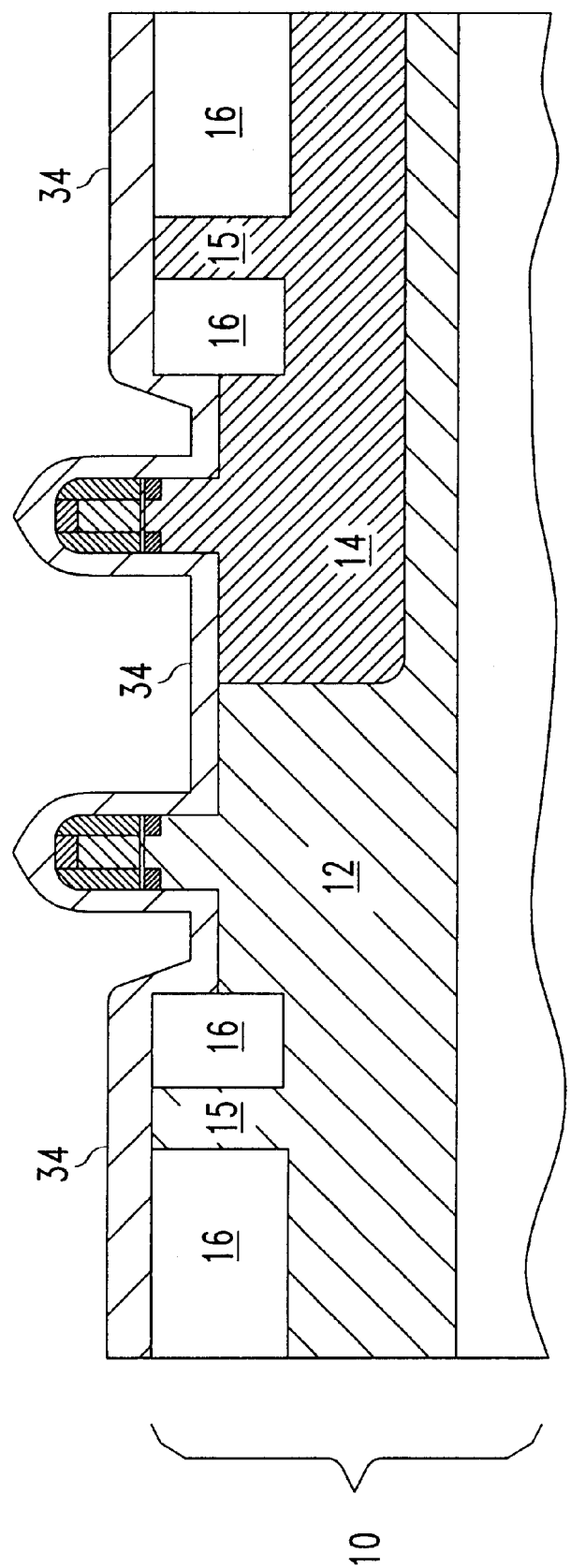

FIG. 6 shows the structure after insulating layer 34 has been formed on all exposed surfaces (including horizontal and vertical) of the structures. That is, in the structure shown in FIG. 6 insulating layer 34 is formed atop the recessed semiconductor substrate, the isolation regions, the well contact regions, and the vertical and horizontal surfaces of the patterned gate stack regions. The insulating layer may be composed of any oxide, nitride or oxynitride material so long as the insulating layer provides the necessary etch selectivity required by subsequent etching processes. Mixtures and multilayers of the aforementioned insulators are also contemplated in the present invention. A highly preferred insulating material is an oxide, with a high-density plasma oxide (HDPO) being more highly preferred. It should be noted that a portion of insulating layer 34 will serve as the backside insulating layer of the inventive JOI structure. HDPO is most preferred in the present invention since it forms predominately on horizontal surfaces, facilitating subsequent contacting of vertical surfaces of source/drain extensions.

Insulating layer 34 may be formed utilizing a conventional deposition process such as CVD, plasma-assisted CVD, evaporation or chemical solution deposition, or alternatively the insulating layer may be formed by a conventional thermal growing process. In a preferred embodiment of the present invention, a conventional deposition process such as high density plasma CVD that is capable of forming an oxide layer that is non-conformal to the sidewall surfaces of each patterned gate stack region is employed. The thickness of the insulating layer formed at this point of the present invention may vary, but typically, insulating layer 34 has a thickness of from about 20 to about 200 nm, with a thickness of from about 50 to about 100 nm being more highly preferred. It is also preferred that insulating material layer 34 forms at least twice as thick on horizontal surfaces than on vertical surfaces.

Figure 7:
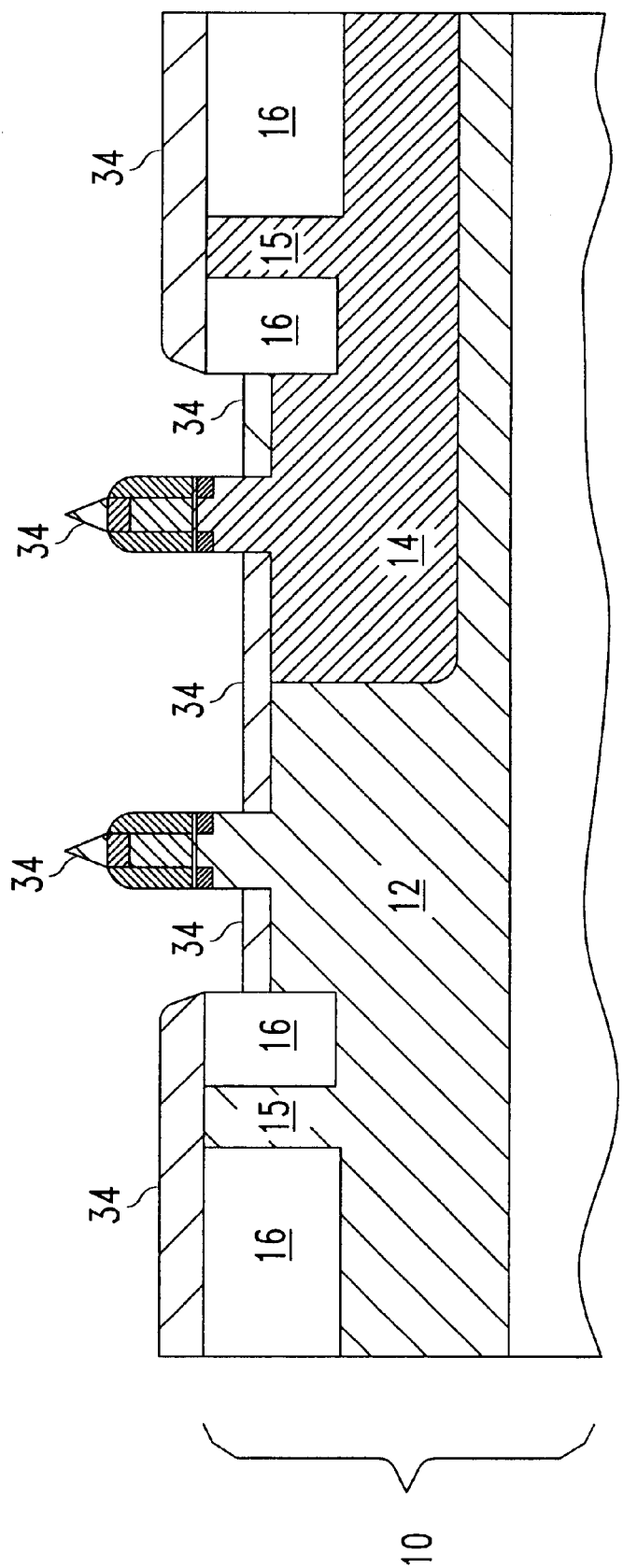

Next, and as shown in FIG. 7, insulating layer 34 is removed from the vertical walls of the each gate stack region utilizing a selective isotropic etching process that is capable of removing the insulating layer from vertical surfaces, leaving the desired thickness of layer 34 on horizontal surfaces. Specifically, the selective etching process comprises a wet etching process wherein a chemical etchant such as dilute HF is employed.

Figure 8:
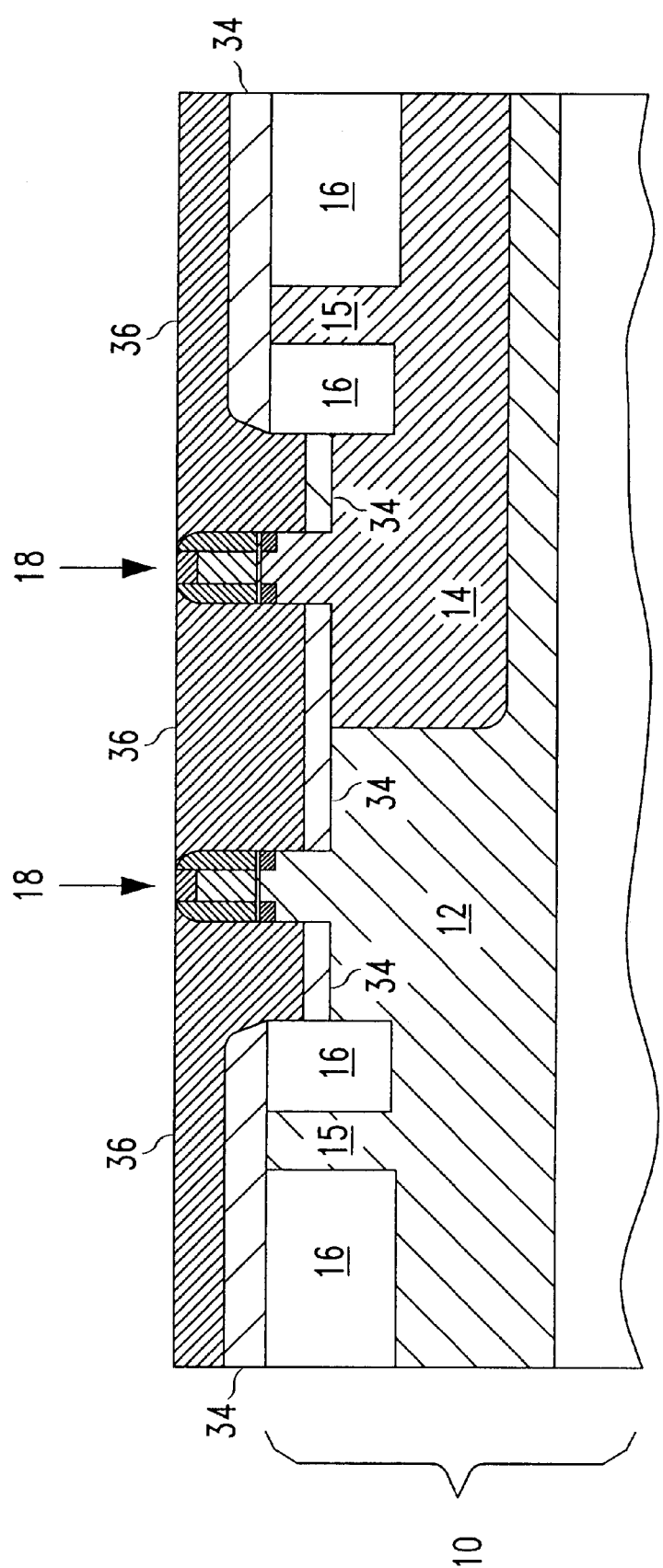
Figure 9:
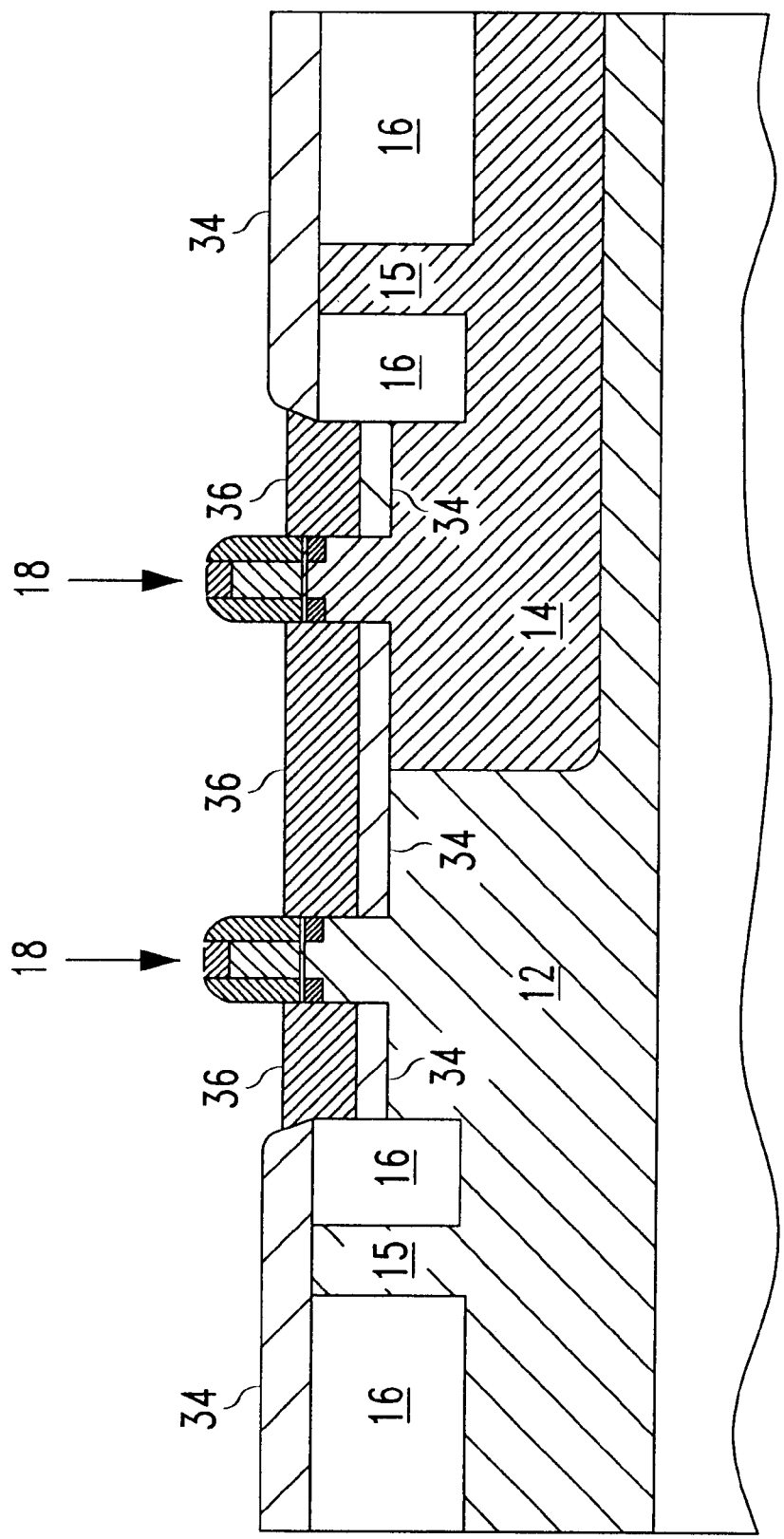

FIG. 8 shows the structure that is obtained after forming a layer of conductive material 36 on the structure. Specifically, the structure shown in FIG. 8 is obtained by overfilling said recessed portions of said semiconductor substrate with a conductive material utilizing a conventional deposition process and thereafter planarizing the conductive material to a top surface of the one or more gate stack regions. The planarizing step includes the use of a conventional planarization process such as chemical-mechanical polishing or grinding.

Suitable conductive materials that are employed at this point of the present invention include the same or different conductive materials as the gate conductor mentioned above. Thus, for example, conductive material 36 may be polysilicon, amorphous Si, an elemental metal, alloys of an elemental metal, silicides of elemental metals, nitrides of elemental metals and any combination thereof including multilayers thereof. In some embodiments, polysilicon and amorphous Si are preferred over the other conductive materials. Note that when other conductive materials are employed besides polysilicon or amorphous Si, it is unnecessary to form heavy source/drain diffusion regions therein.

Following formation of planarizing conductive material layer 36, the structure shown in FIG. 8 is subjected to a selective recessing process wherein a portion of conductive material layer 36 abutting the sidewalls of the gate stack region is removed. Note that the selective recessing process stops above insulating layer 34 that abuts the source/drain extension regions. Any conventional etching process which is highly selective in removing conductive material can be employed in the present invention. For example, a reactive ion etching process which utilizes a plasma comprising HBr and $Cl_2$ can be used to provide the structure shown in FIG. 9. If conductive material 36 is other than polysilicon or amorphous Si, it is required that the top surface of insulating layer 34 be within the source/drain extension regions 20 to avoid shorting the source/drain diffusions to the wells. It may be required to deepen the source/drain extensions 20 to achieve this result.

Figure 10:
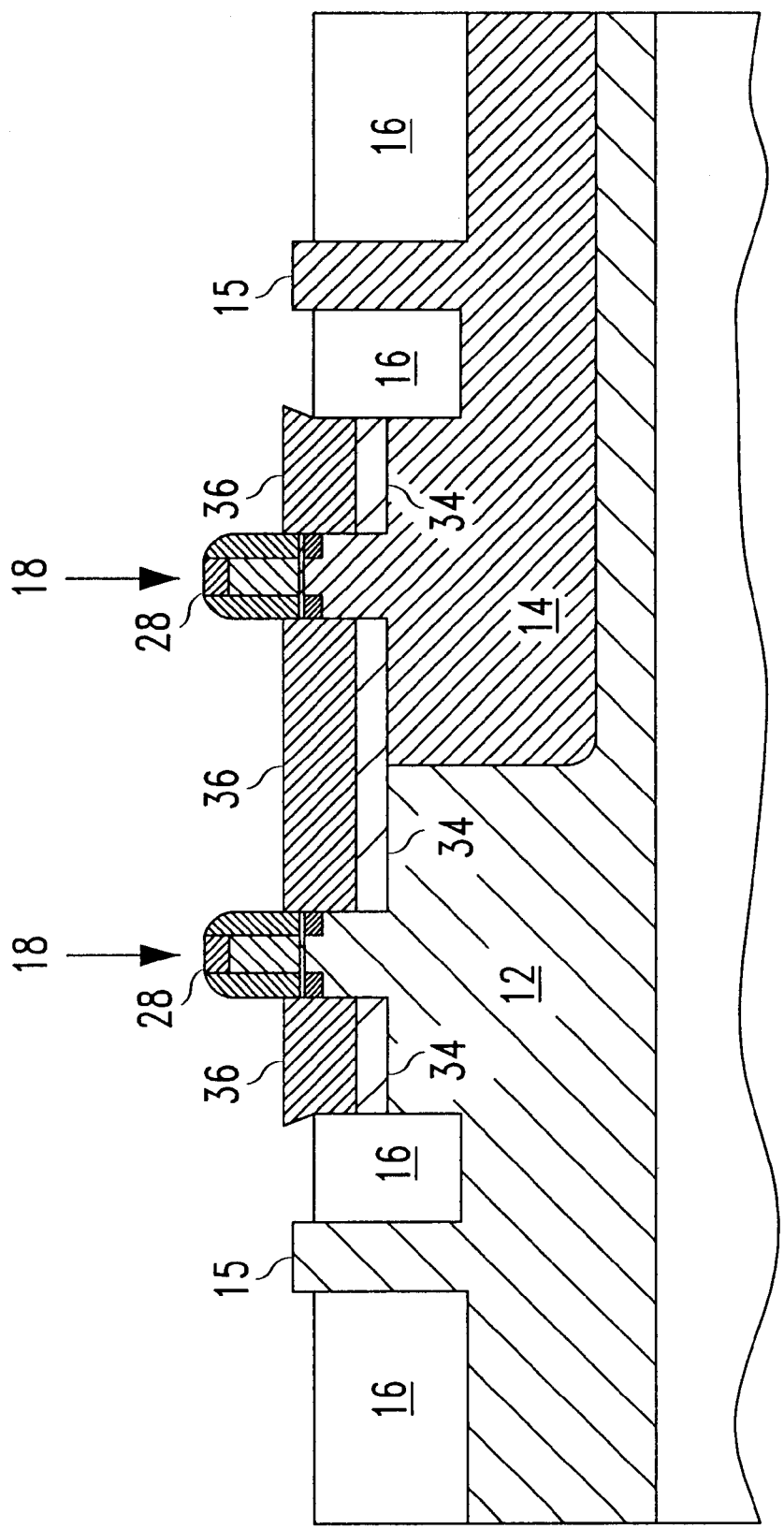

FIG 10 shows the structure that is obtained after insulating layer 34 has been removed from over the well contact regions as well as the isolation regions. As is shown in this figure, the exposed well contacts extend above the surface of the structure. The insulating layer (i.e., layer 34) is removed at this point of the present invention using any chemical wet etching process which exhibits a high selectivity for removing insulating material. For example, a dilute HF solution can be used at this point of the present invention.

Figure 11:
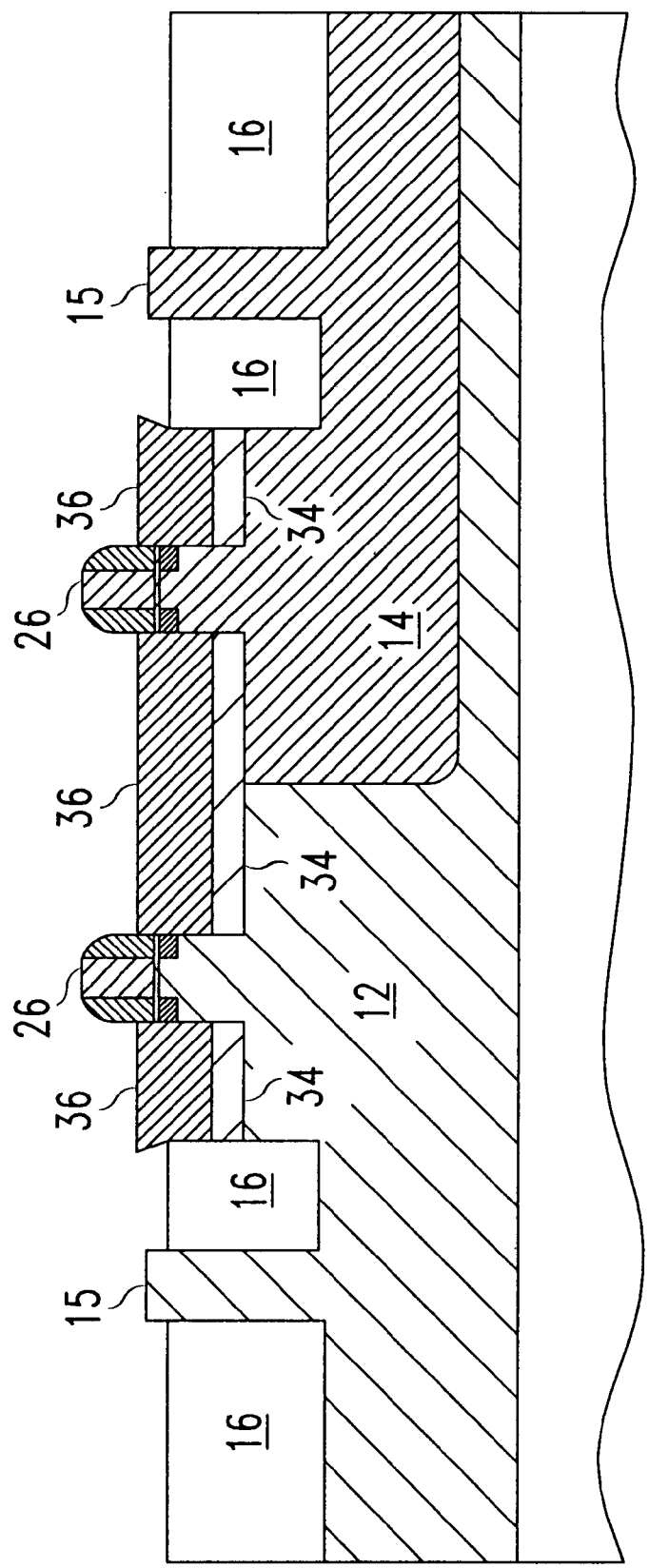

FIG. 11 shows the structure after dielectric capping layer 28 is removed from atop each of the patterned gate stack regions. Specifically, the dielectric capping layer is removed utilizing an etching process which is highly selective in removing the dielectric capping layer. For example, when the dielectric capping layer is comprised of a nitride or an oxynitride, a reactive ion etching process which includes a plasma mixture of $CH_3F$, Ar and $O_2$ can be employed.

Figure 12:
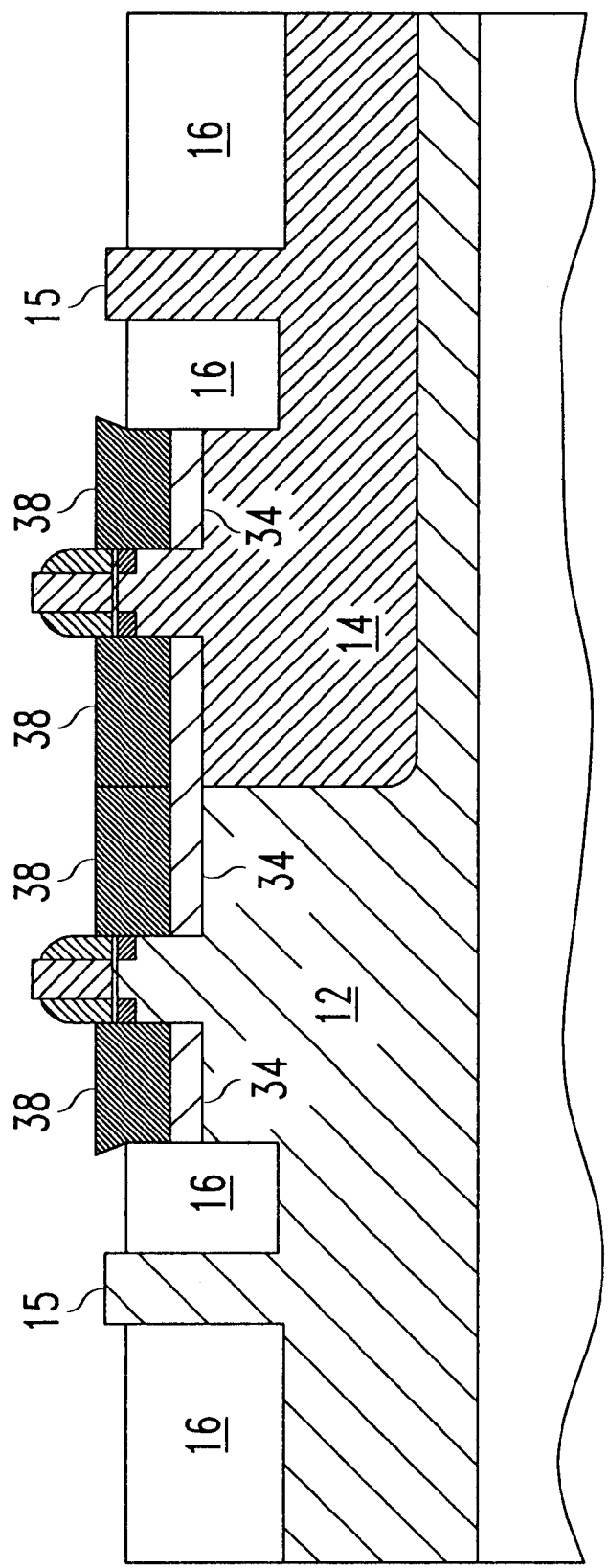

FIG. 12 illustrates the JOI structure of the present invention after heavy source/drain diffusion regions 38 are formed in recessed conductive material layer 36 that abuts sidewalls of the source/drain extension regions. Specifically, the heavy source/drain diffusion regions may, in one embodiment, be formed utilizing a conventional ion implantation process wherein ion doses of about 1E15 atoms/$cm^2$ or above are employed. The implant regions may be activated at this point of the present invention utilizing a conventional activation annealing process wherein annealing temperatures of about 900° C. or higher are employed. Alternatively, a conventional gas phase doping, solid source doping or plasma immersion doping may be employed in forming heavy source/drain diffusion regions 38. Note that the formation of the heavy source/drain diffusion regions may be omitted in circumstances wherein conductive material layer 36 is a conductive material other than polysilicon or amorphous Si. Note that at this point of the inventive process, the abutting source/drain diffusions of opposite dopant polarity are formed. Specifically, P+ type doping is carried out above the N-well region, while N+ doping is carried above the P-well region.

Following the above processing steps, the structure may be subjected to a conventional silicidation process wherein a salicide region (i.e., self-aligned silicide region) 55 (See, FIGS. 2A–2B, for example) is formed atop any exposed Si surface. The salicide process includes deposition of an elemental metal such as Ti, Ni, W or Co on exposed Si surfaces, annealing the elemental metal and Si layers at a temperature of about 500° C. or above so as to convert the same to a metal silicide region, and removing any non-reacted elemental metal from the structure.

After forming the salicide region, cross-connect 77 (see dotted lines in FIG 2A) is formed on a portion of the salicide region using conventional processes well known in the art. For example, the process of forming cross-connect 77 may comprise forming an interlevel dielectric layer over the structure; opening vias in the interlevel dielectric; filling said vias with a conductive material such as, for example, W; and forming conductive wiring connecting the metal filled vias. Well-known subtractive etching, damascene or dual damascene processes may be used to define cross-connect 77.

Cross-connect 77, which is comprised of a conductive element such as a conductive elemental metal, an alloy of a conductive elemental metal, a silicide or nitride of a conductive elemental metal, polysilicon or amorphous Si, is employed in the inventive cell layout to connect one portion of the cell with another portion of the cell.

As shown, in the inventive SRAM cell layout wordlines, WL, of the cell run orthogonal to bitlines, BL (BL* is the bitline complement). Vdd and GND have the same meaning as mentioned hereinabove. Note that the JOI structures shown in FIGS. 2B and 3 may also be used in other applications; e.g., in an inverter layout, a sense amplifier layout, a differential amplifier layout or a 6transistor SRAM cell. The other applications, i.e., cell layouts, are not specifically shown herein.

FIGS. 13–16 show an alternative method of the present invention wherein disposable spacers are employed. This alternative embodiment results in the formation of a JOI structure which includes at least one patterned gate stack region 18 present atop semiconductor substrate 10, said at least one patterned gate stack region having small, controlled dimension regions of conductive material (36 or 38) adjacent thereto, each of which is in contact with semiconductor substrate 10 and self-aligned to an adjacent gate edge (labeled as 19).

Figure 13:
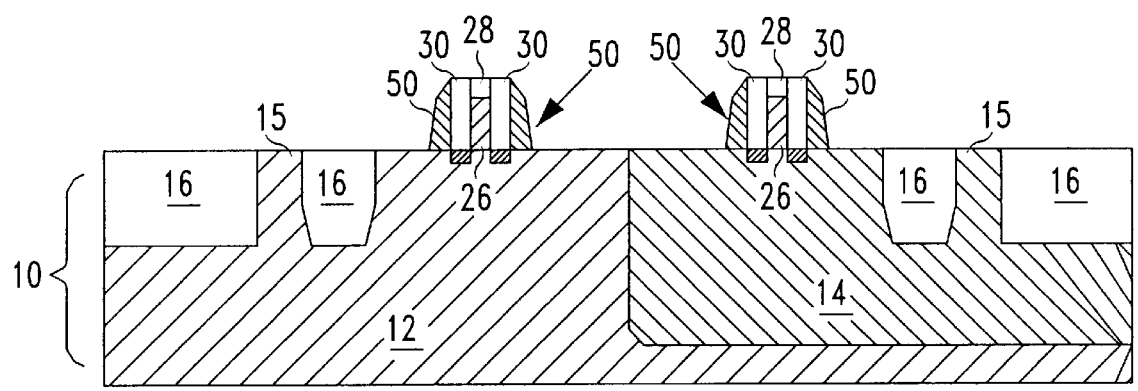
FIGS. 13–16 are pictorial representations (through cross-sectional views) showing an alternative method that can be employed in fabricating an alternative JOI structure of the present invention.

Specifically, FIG. 13 shows the initial structure used in the alternative embodiment of the present invention which is the same as that shown in FIG. 4 except for the presence of disposable spacers 50. Note that that the disposable spacers are formed atop insulating spacers 30 surrounding the vertical sidewalls of the gate stack. The disposable spacers are composed of an insulating material that differs from that of insulating spacers 30.

Figure 14:
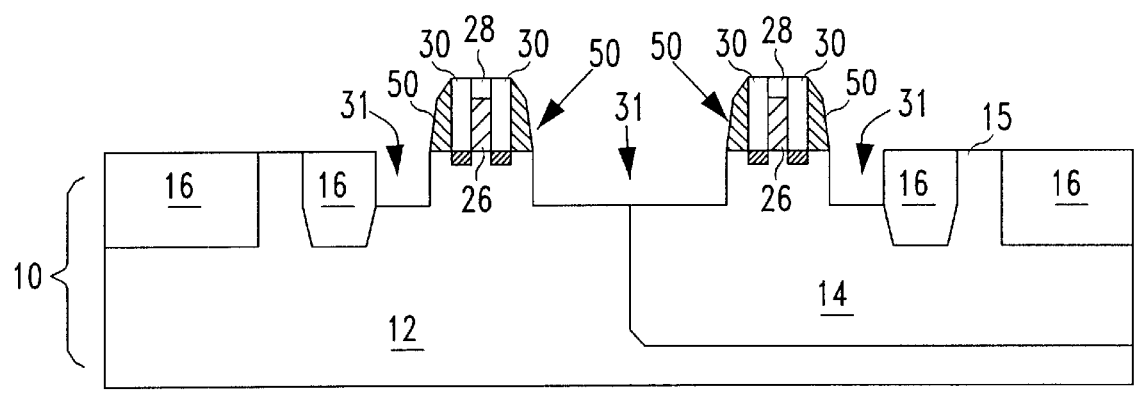
Figure 15:
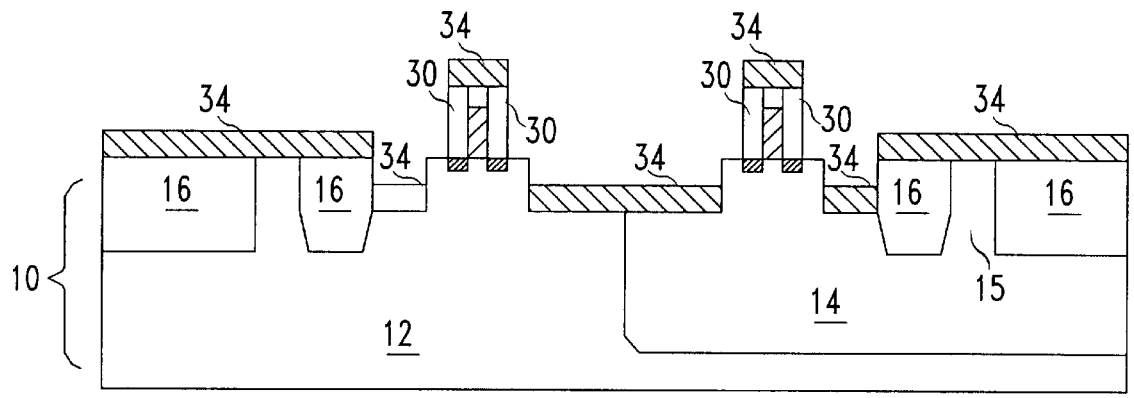

With the disposable spacers in place, the structure shown in FIG. 13 is subjected to the selective recessing process mentioned above in connection with FIG. 5 so as to provide the structure shown in FIG. 14. The disposable spacers are then removed utilizing a conventional stripping process well known in the art (See, for example, the structure shown in FIG. 15) and thereafter the various processing steps mentioned above in connection with FIGS. 6–12 are performed. The resultant JOI structure from the alternative embodiment is shown in FIG. 16.

The purpose of the disposable spacer is to provide a mask for forming small, controlled dimension regions of Si (or other conductive material), each of which is in contact with the substrate and self-aligned to an adjacent gate edge. The regions of Si adjacent to the gate edges provide increased area for forming source/drain diffusion regions in a single crystalline substrate, reducing leakage associated with the proximity of the noncrystalline Si source/drain regions to the junction edge. Furthermore, the structure realized by this alternative embodiment of the present invention provides a landing area over the substrate for formation of a salicide (i.e., self-aligned silicide) layer, eliminating the concern that doping under the salicide layer may be compensated by interdiffusion of adjacent source/drain doping regions.

Figure 16:
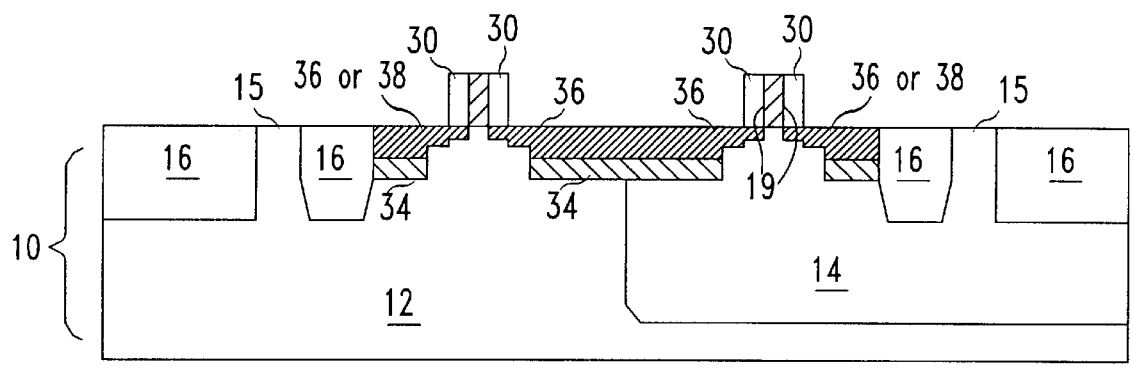

Salicide regions, and/or cross-contacts as defined above may be formed on the alternative JOI structure shown in FIG. 16.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope and spirit of the appended claims.

Having thus described our invention in detail, what we claim as new and desire to secure by the Letters Patent is:

1. A JOI structure comprising:
   at least one patterned gate stack region present atop a semiconductor substrate, said semiconductor substrate having source/drain diffusion regions of opposite dopant polarity abutting each other present therein, said source/drain diffusion regions are present atop an insulating layer, said insulating layer not being present beneath said at least one patterned gate stack region.

2. The JOI structure of claim 1 wherein said semiconductor substrate comprises a semiconductor material selected from the group consisting of Si, Ge, SiGe, GaAs, InAs. InP, Si/Si and Si/SiGe.

3. The JOI structure of claim 1 wherein said semiconductor substrate comprises Si.

4. The JOI structure of claim 1 wherein said semiconductor substrate includes N-well regions and P-well regions.

5. The JOI structure of claim 1 wherein said semiconductor substrate includes isolation regions, said isolation regions not separating said abutting source/drain regions of opposite dopant polarity.

6. The JOI structure of claim 5 wherein said isolation regions include shallow trench isolation regions, local oxidation of silicon oxidation regions or any combination thereof.

7. The JOI structure of claim 1 further comprising source/drain extension regions formed beneath a portion of said at least one patterned gate stack region so as adjoin said source/drain diffusion regions of opposite dopant polarity.

8. The JOI structure of claim 1 wherein said at least one patterned gate stack region comprises at least a gate dielectric formed atop said semiconductor substrate, a gate conductor formed atop said gate dielectric and insulating spacers formed on exposed vertical sidewalls of said gate dielectric and gate conductor.

9. The JOI structure of claim 8 wherein said gate dielectric comprises $SiO_2$, $Si_3N_4$, $ZrO_2$, $Ta_2O_5$, $HfO_2$ or $Al_2O_3$.

10. The JOI structure of claim 8 wherein said gate conductor is a conductive material selected from the group consisting of polysilicon, amorphous silicon, a conductive elemental metal, an alloy of a conductive elemental metal, a silicide or nitride of a conductive elemental metal and any combination or stack thereof.

11. The JOI structure of claim 8 wherein said insulating spacers are composed of an oxide, nitride, oxynitride or any combination and multilayer thereof.

12. The JOI structure of claim 1 wherein said insulating layer is comprised of an oxide. a nitride, an oxynitride or combinations and multilayers thereof.

13. The JOI structure of claim 12 wherein said insulating layer is an oxide.

14. The JOI structure of claim 13 wherein said oxide is a high-density plasma oxide.

15. The JOI structure of claim 1 wherein said insulating layer has a thickness of from about 20 to about 200 nm.

16. The JOI structure of claim 15 wherein said insulating layer has a thickness of from about 50 to about 100 nm.

17. The JOI structure of claim 1 further comprising a salicide region formed at least atop said source/drain diffusion regions of opposite dopant polarity.

18. The JOI structure of claim 1 wherein said salicide region comprises titanium silicide, nickel silicide, tungsten silicide or cobalt silicide.

19. The JOI structure of claim 17 further comprising a cross-connect formed on a portion of said salicide region.

20. The JOI structure of claim 19 wherein said cross-connect comprises a conductive material.

21. A cell layout comprising:
   at least one patterned gate stack region present atop a semiconductor substrate, said semiconductor substrate having source/drain diffusion regions of opposite dopant polarity abutting each other present therein, said source/drain diffusion regions are present atop an insulating layer, said insulating layer not being present beneath said at least one patterned gate stack region.

22. The cell layout of claim 21 wherein said cell is a static random access memory (SRAM) cell, 6 transistor SRAM cell, an inverter cell, sense amplifier, or differential amplifier.

* * * * *